US009286951B2

(12) United States Patent
Okada et al.

(10) Patent No.: US 9,286,951 B2
(45) Date of Patent: Mar. 15, 2016

(54) MEMORY CARD AND SD CARD (71) Applicant: Kabushiki Kaisha Toshiba, Minato-ku (JP)

(72) Inventors: Takashi Okada, Kanagawa (JP); Atsuko Seki, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/594,693

(22) Filed: Jan. 12, 2015

(65) Prior Publication Data

US 2015/0124541 A1 May 7, 2015

Related U.S. Application Data (62) Division of application No. 13/665,451, filed on Oct. 31, 2012, now abandoned.

(60) Provisional application No. 61/640,491, filed on Apr. 30, 2012.

(51) Int. Cl.
| H05K 1/02 | (2006.01) |
| G11C 5/06 | (2006.01) |
| H05K 7/02 | (2006.01) |
| H05K 7/14 | (2006.01) |
| G06K 19/077 | (2006.01) |
| G11C 5/02 | (2006.01) |

(52) U.S. Cl.
CPC .......... *G11C 5/063* (2013.01); *G06K 19/07732* (2013.01); *G11C 5/02* (2013.01); *H05K 7/02* (2013.01); *H05K 7/14* (2013.01); *H01L 2224/49171* (2013.01)

(58) Field of Classification Search
CPC ... H05K 7/02; G06K 19/07732; G11C 5/063; G11C 5/02; H01L 2224/49171
USPC ......... 361/728, 748, 752, 774, 760, 761, 736, 361/772, 737; 257/679, 723, 777; 365/198
See application file for complete search history.

(56) References Cited

U.S. PATENT DOCUMENTS 6,040,622 A * 3/2000 Wallace ........................ 257/679
6,686,663 B2 * 2/2004 Masuda et al. ................ 257/777

(Continued)

FOREIGN PATENT DOCUMENTS

JP          5-18053 U      3/1993
JP       2003-110202       4/2003

(Continued)

OTHER PUBLICATIONS

Office Action issued Jan. 26, 2015 in Taiwanese Patent Application No. 102105697 (with English translation).

Primary Examiner — Angel R Estrada
Assistant Examiner — Dimary Lopez Cruz
(74) Attorney, Agent, or Firm — Oblon, McClelland, Maier & Neustadt, L.L.P.

(57) ABSTRACT

According to one embodiment, there are provided a memory which is provided on a circuit board, a controller which is provided on the circuit board and controls the memory, and a signal line which is formed on the circuit board and configured to perform data transmission between the controller and the memory, in which a width of the signal line in the place where the signal line is led out from the memory is large compared with a place disposed under the memory.

6 Claims, 8 Drawing Sheets

(56) References Cited

U.S. PATENT DOCUMENTS

| | | | |
|---|---|---|---|
| 6,924,547 B2 * | 8/2005 | Kanemoto et al. | 257/666 |
| 7,032,827 B2 | 4/2006 | Wang et al. | |
| 7,102,222 B2 | 9/2006 | Kuo et al. | |
| 7,120,029 B2 * | 10/2006 | Nishizawa et al. | 361/737 |
| 7,174,628 B1 | 2/2007 | Wang et al. | |
| 7,269,004 B1 | 9/2007 | Ni et al. | |
| 7,671,454 B2 | 3/2010 | Seko | |
| 8,093,502 B2 | 1/2012 | Mikado et al. | |
| 8,097,939 B2 | 1/2012 | Okada | |
| 8,254,134 B2 | 8/2012 | Hiew et al. | |
| 2005/0073038 A1 | 4/2005 | Kuo et al. | |
| 2009/0168322 A1 | 7/2009 | Okada | |
| 2010/0172112 A1 | 7/2010 | Okada | |
| 2011/0134620 A1 | 6/2011 | Kang et al. | |
| 2012/0049378 A1 * | 3/2012 | Asada et al. | 257/773 |

FOREIGN PATENT DOCUMENTS

| | | |
|---|---|---|
| JP | 2003-273486 | 9/2003 |
| JP | 2010-10376 | 1/2010 |
| TW | 200514221 | 4/2005 |
| TW | 200825938 | 6/2008 |
| TW | 200947314 | 11/2009 |

* cited by examiner

MEMORY CARD AND SD CARD

CROSS-REFERENCE TO RELATED APPLICATIONS

This application is a division of and claims the benefit of priority under 35 U.S.C. §120 from U.S. Ser. No. 13/665,451 filed Oct. 31, 2012, and claims the benefit of priority from U.S. Provisional Application No. 61/640,491 filed on Apr. 30, 2012; the entire contents of each of which are incorporated herein by reference.

FIELD

Embodiments disclosed herein relate generally to a memory card and an SD (secure digital) card.

BACKGROUND

An example of a typical memory card includes an SD card. The SD card includes a controller and a memory package which are mounted on a circuit board. Further, examples of methods of mounting the controller on the circuit board include a method of mounting a controller chip on the circuit board using a COB (Chip On Board) technology and a method of mounting a controller package on the circuit board. The circuit board is provided with signal lines through which data transmission is performed between the controller and a memory.

DETAILED DESCRIPTION

In general, according to one embodiment, a memory card is provided with a circuit board, a memory, a controller, and signal lines. The memory is provided on the circuit board. The controller is provided on the circuit board, and controls the memory. The signal lines are formed in the circuit board, and data transmission is performed through the signal lines between the controller and the memory. Herein, the width of the signal line in the place where the signal line is led out from the memory is formed to be large compared with the place disposed under the memory.

Referring to the accompanying drawings hereinbelow, the memory card and the SD card according to the embodiments will be described in detail. Further, the invention is not limited to these embodiments.

First Embodiment

Figure 1:
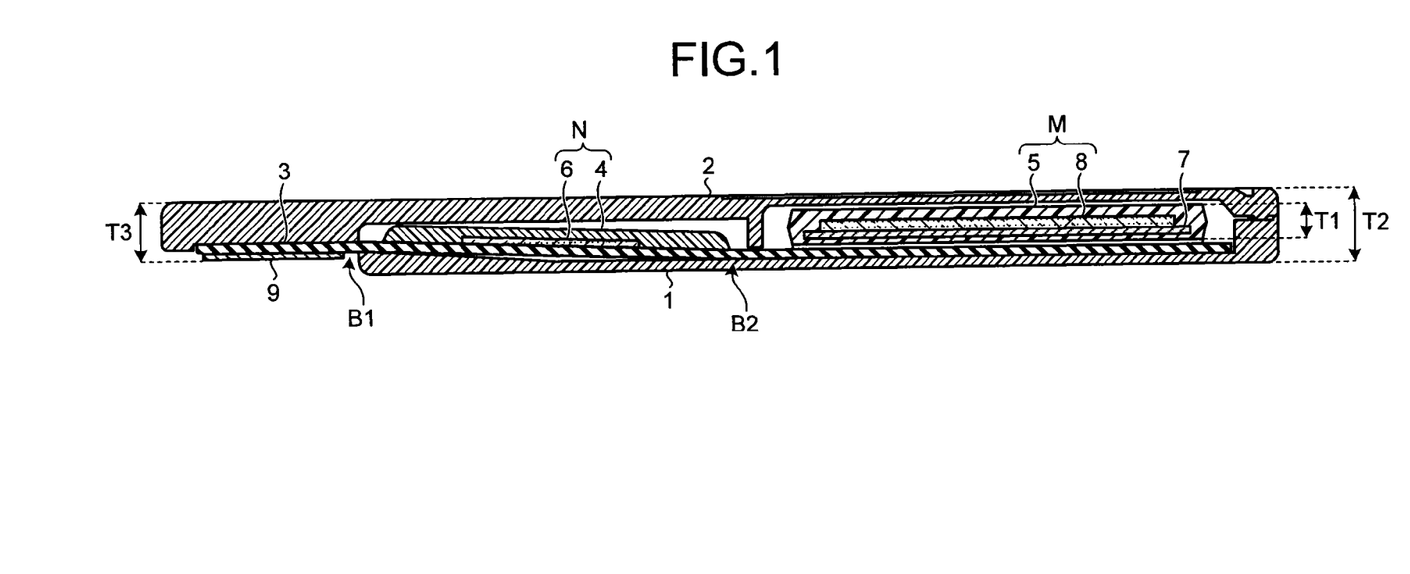
FIG. 1 is a cross-sectional view illustrating a schematic configuration of a memory card according to a first embodiment.

FIG. 1 is a cross-sectional view illustrating a schematic configuration of a memory card according to a first embodiment.

In FIG. 1, the memory card is provided with a circuit board 3, and a memory M and a controller N are provided on the circuit board 3. Further, as the circuit board 3, a double-sided board may be used or a multilayer board may be used. In addition, as the memory M, a nonvolatile semiconductor memory device such as a NAND flash memory or a resistance variable memory may be used. The controller N can perform a drive control on the memory M. Further, as a drive control performed on the memory M, a read-write control, a block selection, an error correction, and a wear leveling can be performed on the memory M, for example.

The memory M is provided with a memory chip 8, and the memory chip 8 is sealed with a memory package 5 in a state of being mounted on a lead frame 7. Further, a material of the memory package 5 may be made of a sealing resin such as an epoxy resin or a silicon resin. An example of the memory package 5 includes a TSOP (Thin Small Outline L-Leaded Package).

The controller N is provided with a controller chip 6, and the controller chip 6 is COB-mounted on the circuit board 3. Further, a board for the memory chip 8 and the controller chip 6 may be made of a semiconductor. Examples of the semiconductor include Si, Ge, SiGe, GaAs, InP, GaP, InGaAs, GaN, SiC, and the like. Then, the controller chip 6 is sealed with the sealing resin 4 on the circuit board 3. Further, the material of the sealing resin 4 may include the epoxy resin, the silicon resin, or the like.

Further, the circuit board 3 on which the memory M and the controller N are provided is accommodated to a space between a lower case 1 and an upper case 2. Herein, an external terminal 9 is formed on the rear surface of the circuit board 3, and the external terminal 9 is exposed from the lower case 1.

Herein, in the standards of the SD card, the total thickness T2 of the lowercase 1 and the upper case 2 is set to, for example, 2.1 mm, and a distance T3 from the uppermost surface of the upper case 2 to the surface of the external terminal 9 is set to, for example, 1.4 mm. At this time, in a case where the thickness T1 of the memory package 5 is large, in order to put the memory package 5 between the lower case 1 and the upper case 2, the memory package 5 is disposed on a deeper position of the lower case 1. At this time, the thickness of the lower case 1 under the memory package 5, for example, may be set from 0.3 to 0.4 mm. In addition, in a case where the distance T3 is set to 1.4 mm, the surface of the external terminal 9 is necessarily disposed on a higher position by 0.7 mm from the bottom surface of the lower case 1. For this reason, the circuit board 3 is bent such that the external terminal 9 is lifted up from the bottom surface of the lower case 1. At this time, the circuit board 3 may be provided with bent portions B1 and B2. The bent portion B1 may be provided between the sealing resin 4 and the external terminal 9, and the bent portion B2 may be provided between the sealing resin 4 and the memory package 5.

Figure 2:
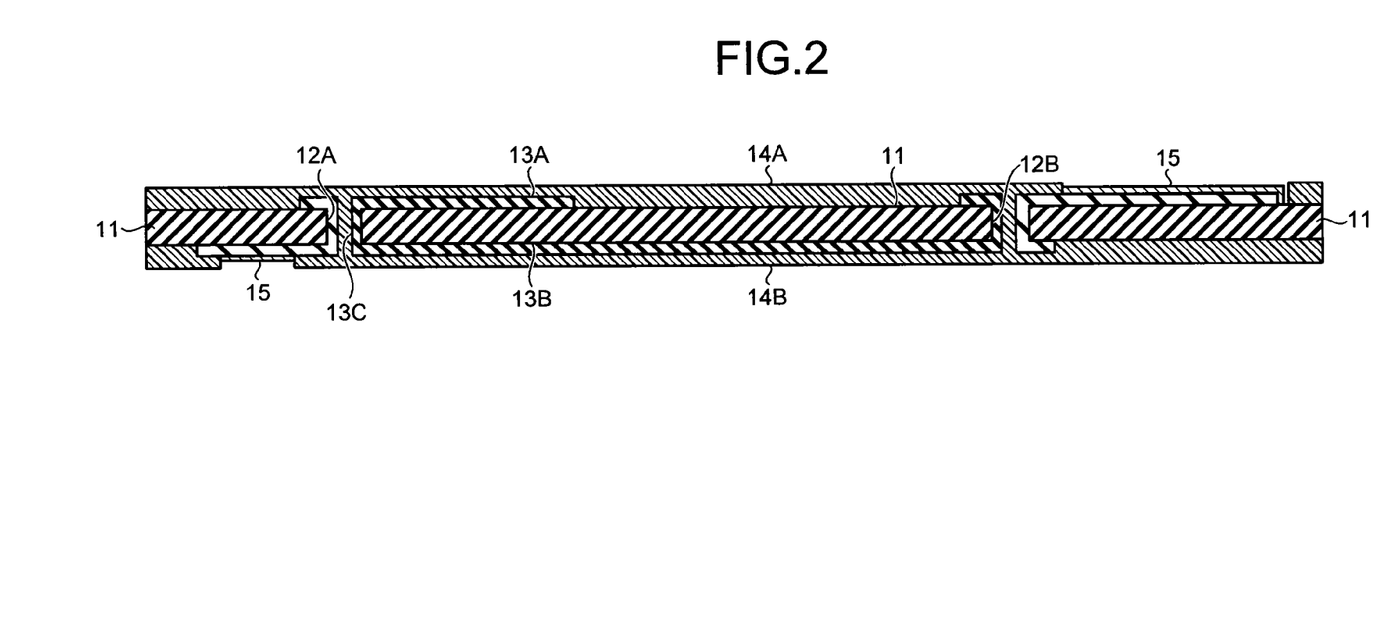
FIG. 2 is a cross-sectional view illustrating a schematic configuration of a circuit board of the memory card of FIG. 1.

FIG. 2 is a cross-sectional view illustrating a schematic configuration of the circuit board of the memory card of FIG. 1. Further, FIG. 2 gives an example in which the double-sided board is used as the circuit board.

In FIG. 2, the circuit board 3 is provided with an insulating board 11. Further, the insulating board, for example, may include a resin board which is configured of a glass epoxy resin or the like, or may include a sheet board which is configured of polyimide, polyester, or the like. Then, the surface of the insulating board 11 is formed with a conductor pattern 13A, and the rear surface of the insulating board 11 is formed with a conductor pattern 13B. In addition, the insulating board 11 is formed with through holes 12A and 12B, and the through holes 12A and 12B are formed with a through hole line 13C. Herein, the conductor patterns 13A and 13B may be connected to each other through the through hole line 13C. Further, the materials of the conductor patterns 13A and 13B and the through hole line 13C may include metal such as Cu or Al.

In addition, the surface of the insulating board 11 is formed with a solder resist film 14A to cover the conductor pattern 13A, and the rear surface of the insulating board 11 is formed with a solder resist film 14B to cover the conductor pattern 13B. Herein, a part of the conductor pattern 13A is exposed from the solder resist film 14A, and a part of the conductor pattern 13B is exposed from the solder resist film 14B. Then, the exposed surfaces of the conductor patterns 13A and 13B are formed with a plating layer 15. Further, the material of the plating layer 15 may include Au, Ni, or the like.

Figure 3:
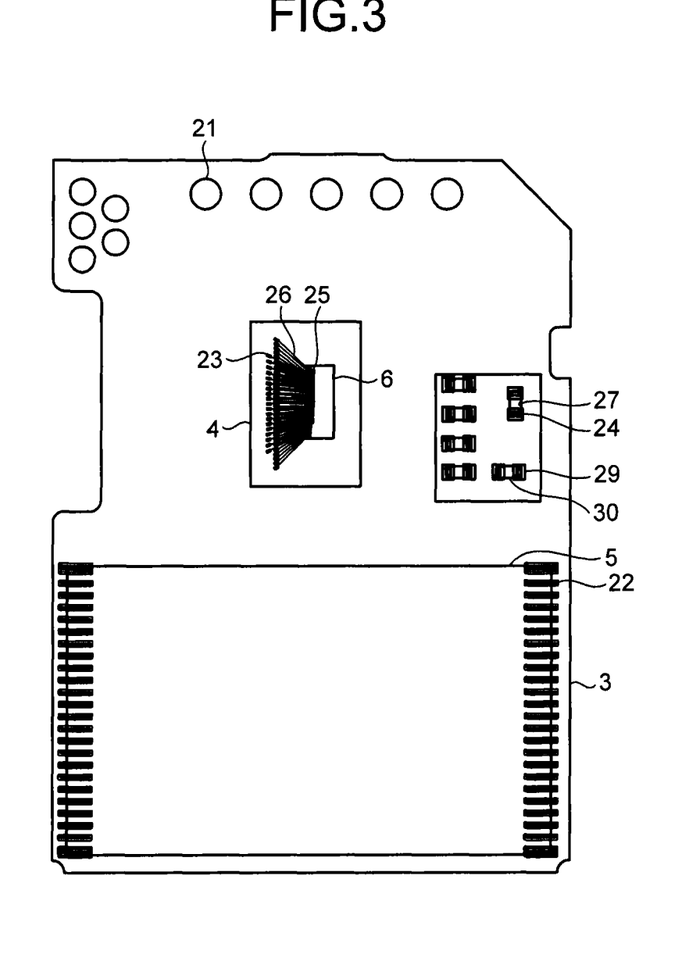
FIG. 3 is a plane view illustrating a schematic configuration of the memory card according to the first embodiment.

FIG. 3 is a plane view illustrating a schematic configuration of the memory card according to the first embodiment.

In FIG. 3, the circuit board 3 is provided with land electrodes 21 to 24 and 29. Further, the land electrodes 21 to 24 and 29 may be configured using a part of the conductor pattern 13A of FIG. 2. The controller chip 6 is provided with a pad electrode 25. Further, the material of the pad electrode 25 may include metal such as Cu or Al. Then, the pad electrode 25 is connected to the land electrode 23 through a bonding wire 26. The bonding wire 26 is sealed with the sealing resin 4 on the circuit board 3 together with the controller chip 6. In addition, on the circuit board 3, the memory package 5 is mounted through the land electrode 22. In addition, on the circuit board 3, a fuse 27 is mounted through the land electrode 24, and a capacitor 30 is mounted through the land electrode 29. Further, the land electrode 21 may be used for exchanging signals between the controller chip 6 and an external device of the circuit board 3.

Figure 4A:
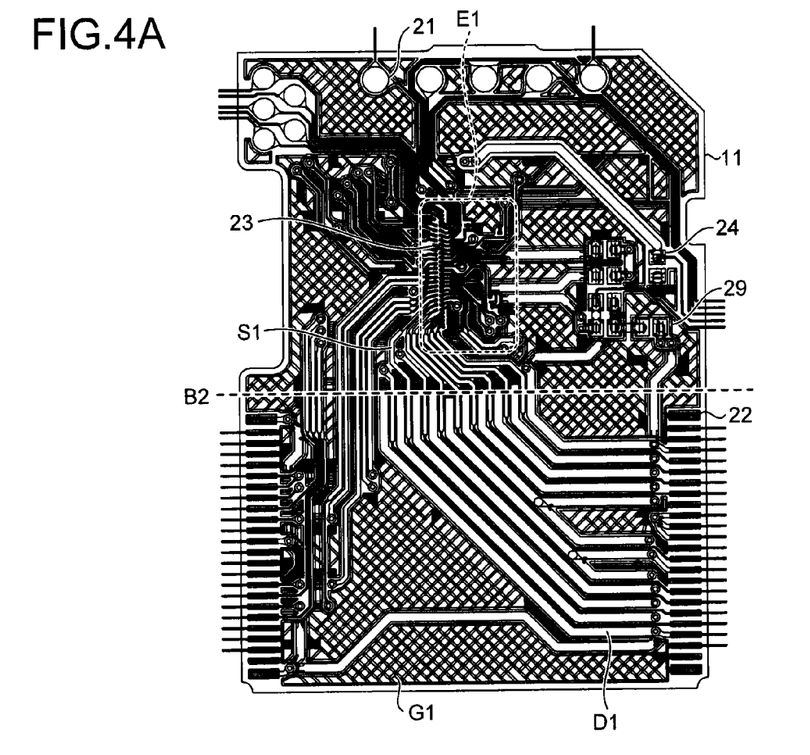
FIG. 4A is a plane view illustrating a schematic configuration of a controller chip on a mounting surface side in the circuit board of FIG. 1.
Figure 4B:
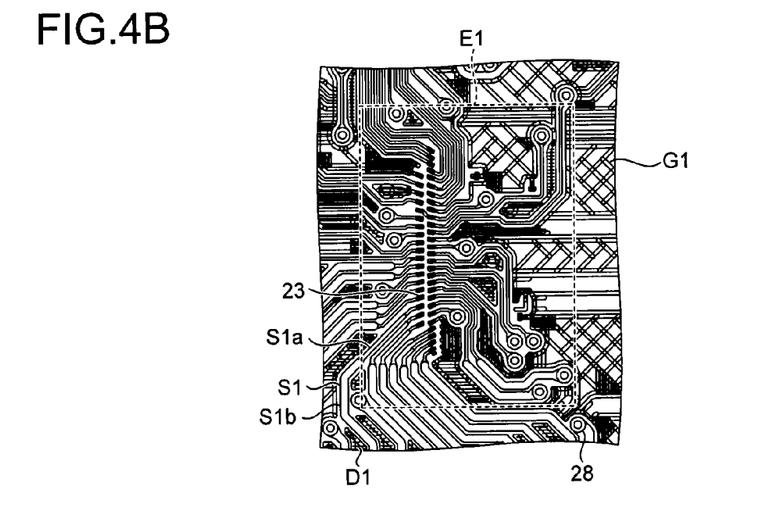
FIG. 4B is a plane view illustrating the vicinity of a sealing area of FIG. 4A on a magnified scale.

FIG. 4A is a plane view illustrating a schematic configuration of the controller chip on a mounting surface side in the circuit board of FIG. 1, and FIG. 4B is a plane view illustrating the vicinity of a sealing area of FIG. 4A on a magnitude scale.

In FIGS. 4A and 4B, a signal line S1, a power line D1, and a ground pattern G1 are provided on the circuit board 3. Further, the signal line S1, the power line D1, and the ground pattern G1 may be configured using a part of the conductor pattern 13A of FIG. 2. Power can be supplied to the memory chip 8 and the controller chip 6 through the power line D1. Data transmission can be performed between the controller N and the memory M through the signal line S1.

In addition, the sealing area E1 is provided on the circuit board 3. The sealing resin 4 is disposed on the sealing area E1. In addition, the circuit board 3 is formed with a through hole 28.

Herein, the width of the signal line S1 in the place where the signal line is led out from the memory M may be large compared with the place disposed under the memory M. Herein, the place where the signal line is led out from the memory M, for example, may be set as the boundary portion of the memory package 5. Alternatively, the width of the signal line S1 in the place where the signal line is led out from the controller N may be formed to be large compared with the place disposed under the controller N. Herein, the place where the signal line is led out from the controller N, for example, may be set as the boundary portion of the sealing area E1. Alternatively, the width of the signal line S1 in the bent portion B2 of the circuit board 3 may be formed to be large compared with an unbent portion of the circuit board 3.

Herein, in order to make the signal line S1 have a different width, the signal line S1 may be provided with sub-lines S1$a$ and S1$b$. At this time, the width of the sub-line S1$b$ may be formed to be large compared with the width of the sub-line S1$a$. At this time, it is preferable that the width of the sub-line S1$b$ be formed to be large by 2 or more times compared with the width of the sub-line S1$a$. For example, the width of the sub-line S1$a$ may be 70 μm, and the width of the sub-line S1$b$ may be 200 μm or more. Herein, the sub-line S1b may be disposed on the boundary portion of the memory package 5, the boundary portion of the sealing area E1, or the bent portion B2. In other words, the layout position of the sub-line S1$b$ may be set to be disposed on a place where stress or load is heavy compared with the layout position of the sub-line S1$a$. Alternatively, the layout position of the sub-line S1$b$ may be set to be disposed on a place where the stress or the load is fluctuated violently compared with the layout position of the sub-line S1$a$.

Therefore, it is possible to enhancing the strength of the place where the signal line S1 is likely to be broken. Even in a case where the memory card is used under an environment highly vibrating such as in automobile use or portable use, the disconnection of the signal line S1 can be prevented, so that a lifespan of the memory card can be enhanced. In addition, in order to make the signal line S1 highly strengthened, compared with the case where the width of the signal line S1 is made to be uniformly large, the layout area of the signal line S1 can be reduced, and the miniaturization of the memory card can be achieved.

Second Embodiment

Figure 5:
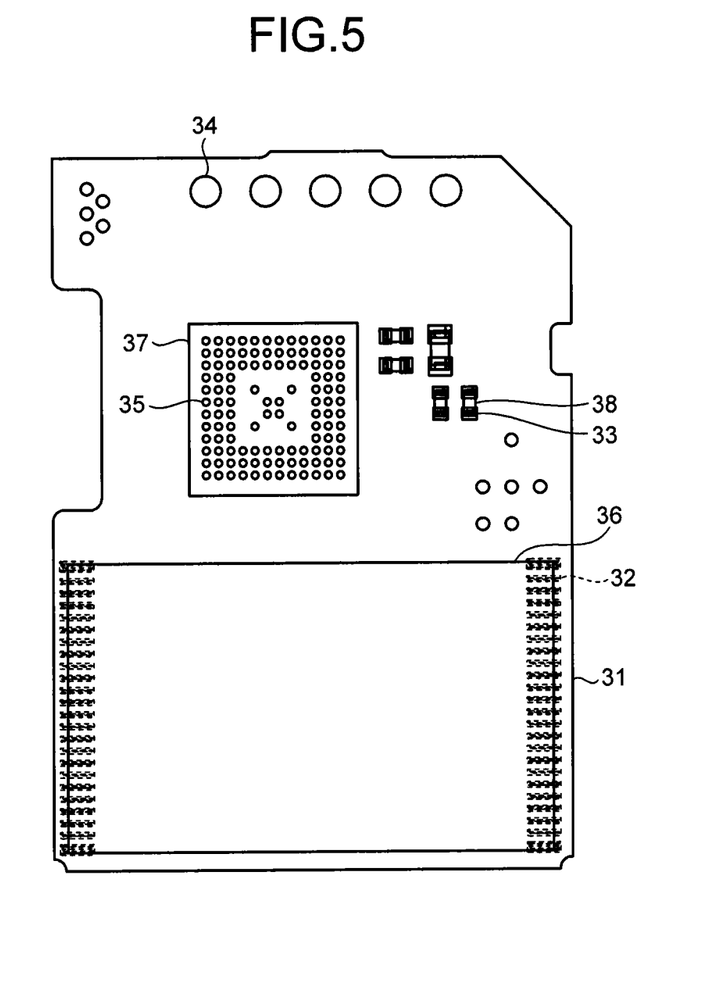
FIG. 5 is a plane view illustrating a schematic configuration of a memory card according to a second embodiment.

FIG. 5 is a plane view illustrating a schematic configuration of a memory card according to a second embodiment.

In FIG. 5, a circuit board 31 is provided with land electrodes 32 to 35. Further, the land electrodes 32 to 35 may be configured using a part of the conductor pattern 13A of FIG. 2. A controller package 37 is sealed with a controller chip. Further, the controller package 37, for example, may include a BGA (Ball Grid Array). The controller package 37 is mounted with the circuit board 31 by bonding a solder ball to the land electrode 35.

In addition, a memory package 36 is mounted on the circuit board 31 through the land electrode 32. The memory package 36 is sealed with the memory chip. Further, the memory package 36, for example, may include a TSOP.

In addition, the capacitor 38 is mounted on the circuit board 31 through the land electrode 33. Further, the land electrode 34 may be used for exchanging signals between the controller chip and an external device of the circuit board 31.

Figure 6A:
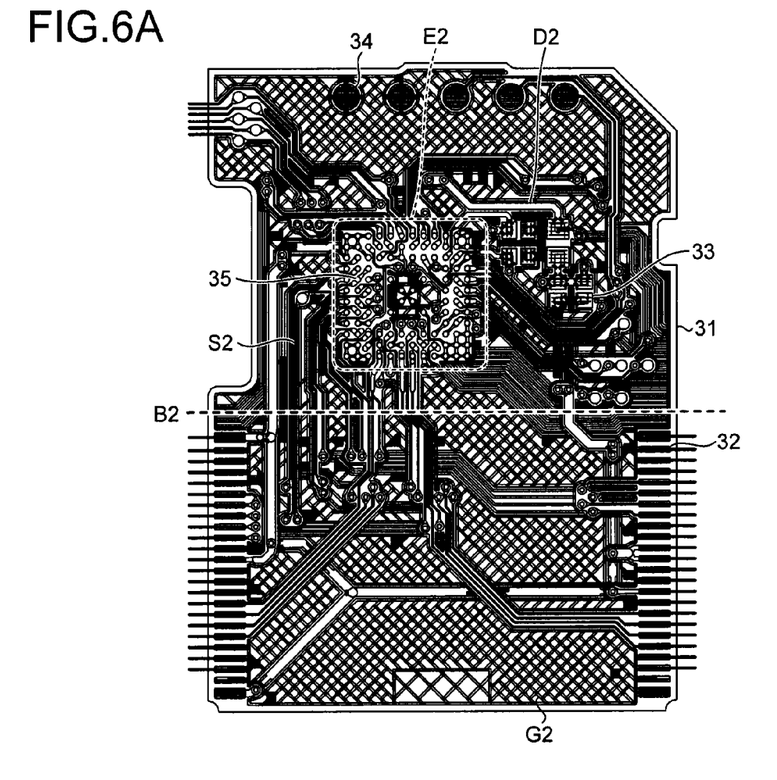
FIG. 6A is a plane view illustrating a schematic configuration of a controller package on a mounting surface side in a circuit board of FIG. 5.
Figure 6B:
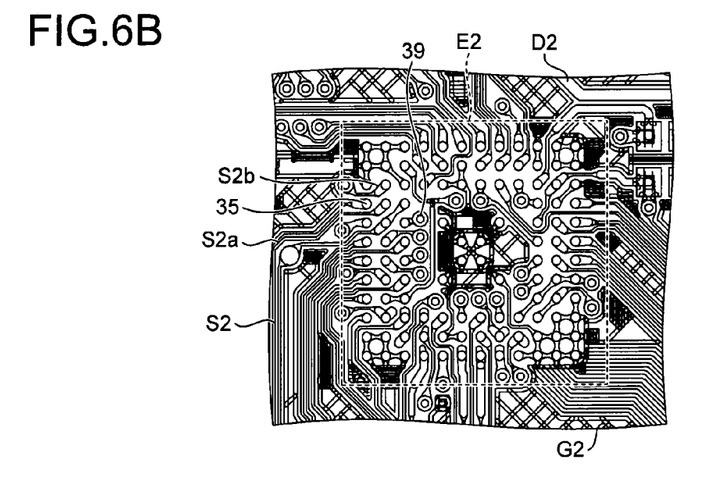
FIG. 6B is a plane view illustrating the vicinity of a package area of FIG. 6A on a magnified scale.

In FIG. 6A is a plane view illustrating a schematic configuration of the controller package on the mounting surface side in the circuit board of FIG. 5, and FIG. 6B is a plane view illustrating the vicinity of the package area of FIG. 6A on a magnified scale.

In FIGS. 6A and 6B, a signal line S2, a power line D2, and a ground pattern G2 are provided on the circuit board 31. Further, the signal line S2, the power line D2, and the ground pattern G2 may be configured using a part of the conductor pattern 13A of FIG. 2. Power can be supplied to the memory chip and the controller chip through the power line D2. Data transmission can be performed between the controller and the memory through the signal line S2. In addition, the package area E2 is provided on the circuit board 31. The controller package 37 is disposed on the package area E2. In addition, a through hole 39 is formed in the circuit board 31.

Herein, the end portion of the signal line S2 is connected to the land electrode 35 in the package area E2. The width of the signal line S2 can be formed to be large in the place near the land electrode 35 compared with the place away from the land electrode 35.

Herein, in order to make the signal line S2 have a different width, the signal line S2 may be provided with sub-lines S2a and S2b. At this time, the width of the sub-line S2b may be formed to be large compared with the width of the sub-line S2a. At this time, it is preferable that the width of the sub-line S2b be formed to be large by 2 or more times compared with the width of the sub-line S2a. For example, the width of the sub-line S2a may be 70 µm, and the width of the sub-line S2b may be 200 µm or more. Then, the end portion of the sub-line S2b is connected to the land electrode 35. The sub-line S2a is connected to the land electrode 35 through the sub-line S2b.

Therefore, even in a case where a load applied to the signal line S2 in the vicinity of the land electrode 35 increases, the disconnection of the signal line S2 can be prevented, so that a lifespan of the memory card can be enhanced. In addition, in order to make the signal line S2 highly strengthened, compared with the case where the width of the signal line S2 is formed to be uniformly large, the layout area of the signal line S2 can be reduced, and the miniaturization of the memory card can be achieved.

Third Embodiment

Figure 7:
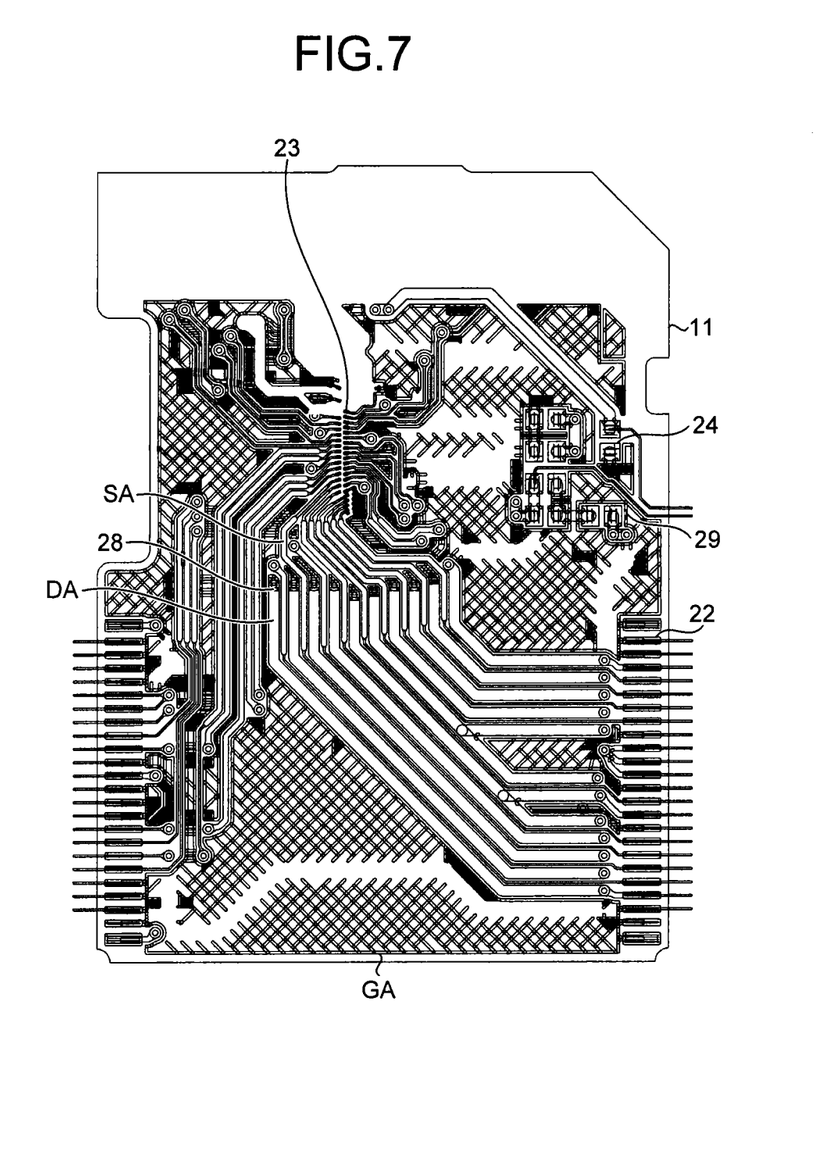
FIG. 7 is a plane view illustrating a schematic configuration of a controller chip on a mounting surface side in a circuit board which is applied to a memory card according to a third embodiment.
Figure 8:
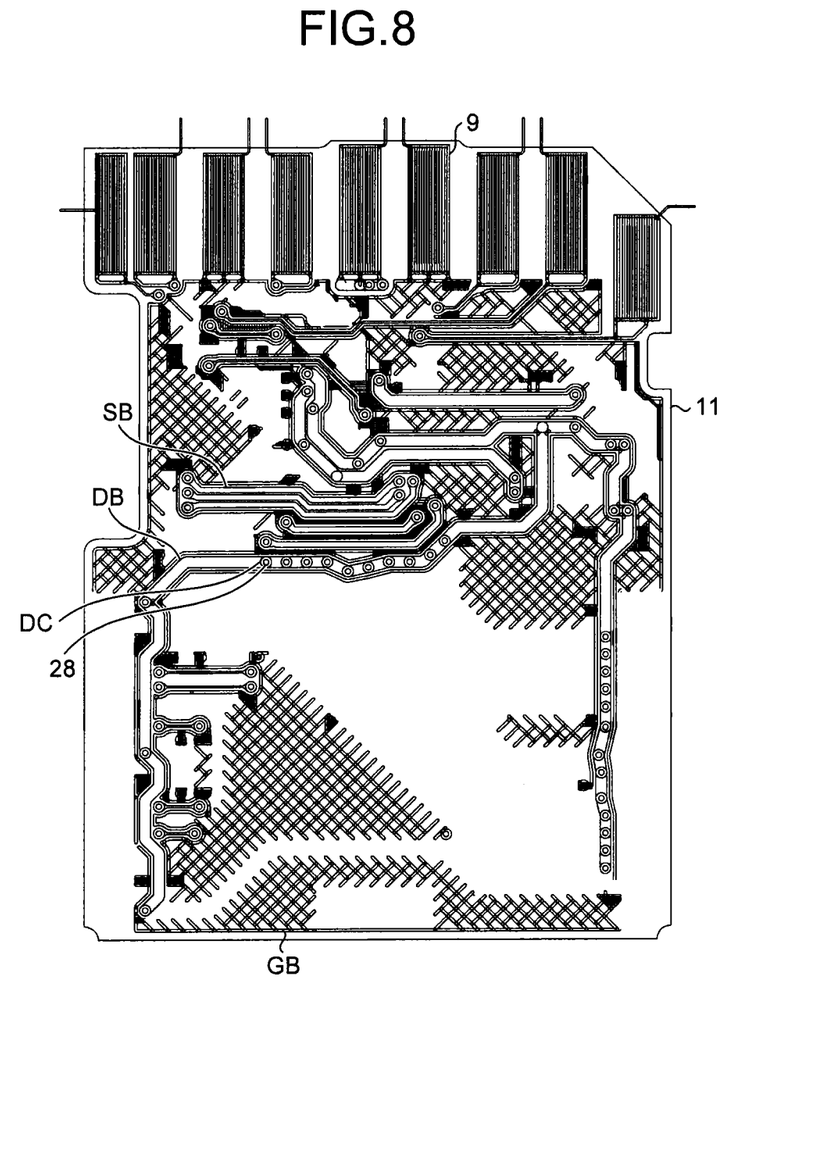
FIG. 8 is a plane view illustrating a schematic configuration of the controller chip on a non-mounting surface side in the circuit board of FIG. 7.

FIG. 7 is a plane view illustrating a schematic configuration of the controller chip on the mounting surface side in a circuit board which is applied to a memory card according to a third embodiment, and FIG. 8 is a plane view illustrating a schematic configuration of the controller chip on a non-mounting surface side in the circuit board of FIG. 7.

In FIGS. 7 and 8, a signal line SA, a power line DA, and a ground pattern GA are provided on the insulating board 11. A signal line SB, a power line DB, a ground pattern GB, and the external terminal 9 are provided on the rear surface of the insulating board 11. Further, the signal line SA, the power line DA, and the ground pattern GA may be configured using a part of the conductor pattern 13A of FIG. 2. The signal line SB, the power line DB, and the ground pattern GB may be configured using a part of the conductor pattern 13B of FIG. 2. In addition, the through hole 28 is formed in the insulating board 11. Herein, a through hole line DC is formed in the through hole 28. Herein, the power lines DA and DB are connected to each other through the through hole line DC. Further, the configuration of the circuit board on the surface side may be the same as that of FIG. 4A. In addition, as illustrated in FIG. 1, the memory M and the controller N can be provided on the circuit board.

Power can be supplied to the memory chip 8 and the controller chip 6 through the power lines DA and DB. Data transmission can be performed through the signal lines SA and SB between the controller N and the memory M. Further, a data transmission rate between the controller N and the memory M can be set about 100 to 200 Mbit/sec per bus wiring for data transmission at maximum.

Herein, the power line DA may be disposed on the circuit board along with the signal line SA so as to be adjacent to the signal line SA. For example, in a case where a plurality of the signal lines SA are disposed in parallel, the power lines DA and the signal lines SA can be alternatively disposed. Further, the width of the power line DA can be formed to be larger than that of the signal line SA. Further, the power lines DA are not necessarily disposed along with the entire signal lines SA, and in particular the power lines may be disposed along with signal lines SA which are required to be operated at a high data transmission rate. In addition, the signal line SA to be operated at a high data transmission rate may be formed such that the width of the power line DA adjacent to the signal line SA becomes large compared with the signal line SA to be operated at a row data transmission rate.

In addition, the power line DB is disposed to intersect the signal line SA on the rear surface side of the circuit board, and the power line DA can be connected to the power line DB through the through hole line DC. With this configuration, the power lines DA which are separated from each other on the surface side of the circuit board can be connected to each other through the power line DB, so that the conductivity of the power lines DA can be enhanced.

In addition, the fuse 27 is mounted on the circuit board through the land electrode 24, and the power line DA is connected to an external device of the circuit board through the fuse 27. With this configuration, it is possible to prevent a large amount of current flowing to the power lines DA and DB, so that the power lines DA and DB can be protected.

In addition, the ground pattern GB can be disposed so as to face the power line DA through the insulating board 11. Herein, the ground pattern GB may be formed in a solid pattern so as to make the ground pattern GB face the power line DA.

When an input/output buffer of the controller N or an input/output buffer of the memory M performs a switching operation, switching noises may occur in the signal line SA. At this time, current flows to the power line DA and the ground pattern GB so as to cancel the switching noises occurred in the signal line SA. Then, a return path of the current is formed by the power line DA and the ground pattern GB, so that an inductance of the signal line SA is reduced and the switching noises occurred in the signal line SA is reduced.

Therefore, the high data transmission rate of the memory card can be achieved, and the data transmission rate can be secured about 100 to 200 Mbit/sec per bus wiring at maximum.

Further, the above-described memory card may be applied to the SD card, or may be applied to other memory cards such as SM (Smart Media) cards, compact flash memories, or USB memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory card comprising:
a circuit board;
a memory which is provided on the circuit board;
a controller which is provided on the circuit board and controls the memory;
a signal line which is formed on the circuit board and configured to perform data transmission between the controller and the memory; and
a power line which is disposed on the circuit board along with the signal line so as to be adjacent to the signal line;
wherein the power line includes
a first power line which is disposed on the circuit board along with the signal line,
a second power line which is disposed on the rear surface of the circuit board so as to intersect the signal line, and
a through hole line which connects the first power line and the second power line.

2. The memory card according to claim 1, further comprising
a ground pattern which is disposed on the rear surface of the circuit board so as to overlap the first power line.

3. The memory card according to claim 2,
wherein the first power line is connected through a fuse.

4. An SD card comprising:
a circuit board;
a memory which is provided on the circuit board;
a controller which is provided on the circuit board and controls the memory;
a signal line which is formed on the circuit board and configured to perform data transmission between the controller and the memory; and
a power line which is disposed on the circuit board along with the signal line so as to be adjacent to the signal line;
wherein the power line includes
a first power line which is disposed on the circuit board along with the signal line,
a second power line which is disposed on the rear surface of the circuit board so as to intersect the signal line, and
a through hole line which connects the first power line and the second power line.

5. The SD card according to claim 4, further comprising
a ground pattern which is disposed on the rear surface of the circuit board so as to overlap the first power line.

6. The SD card according to claim 5,
wherein the first power line is connected through a fuse.

* * * * *